United States Patent
Pus et al.

(10) Patent No.: US 9,978,451 B2
(45) Date of Patent: May 22, 2018

(54) CONNECTION FOR QUICK SEARCH OF REGULAR EXPRESSIONS IN DATA

(71) Applicants: CESNET, zajmove sdruzeni pravnickych osob, Prague (CZ); Netcope Technologies, a.s., Brno (CZ)

(72) Inventors: Viktor Pus, Kurim (CZ); Vlastimil Kosar, Brno (CZ); Jan Korenek, Bilovice nad Svitavou (CZ); Denis Matousek, Ceska Trebova (CZ)

(73) Assignees: CESNET, zajmove sdruzeni pravnickych osob, Prague (CZ); NETCOPE TECHNOLOGIES, a.s., Brno (CZ)

( * ) Notice: Subject to any disclaimer, the term of this patent is extended or adjusted under 35 U.S.C. 154(b) by 0 days. days.

(21) Appl. No.: 15/622,383

(22) Filed: Jun. 14, 2017

(65) Prior Publication Data
US 2017/0358355 A1    Dec. 14, 2017

(30) Foreign Application Priority Data
Jun. 14, 2016   (CZ) ..................... 2016-353

(51) Int. Cl.
G11C 15/04       (2006.01)
G06F 13/16       (2006.01)
G06F 17/30       (2006.01)

(52) U.S. Cl.
CPC .............. G11C 15/04 (2013.01); G06F 13/16 (2013.01); G06F 17/30979 (2013.01)

(58) Field of Classification Search
None
See application file for complete search history.

(56) References Cited

U.S. PATENT DOCUMENTS

| 7,916,510 B1* | 3/2011 | Starovoitov | ........... G11C 15/04 365/49.1 |
| 8,155,150 B1 | 4/2012 | Chung et al. | |

(Continued)

FOREIGN PATENT DOCUMENTS

CZ        303 209 B6     5/2012

OTHER PUBLICATIONS

Search Report dated Mar. 13, 2017, by the Industrial Property Office of the Czech Republic for Application No. PV 2016-353.

*Primary Examiner* — James G Norman
(74) *Attorney, Agent, or Firm* — Buchanan Ingersoll & Rooney PC

(57) ABSTRACT

The presented connection processes a stream data by a computer. The data is split into blocks called packets and the task is to search for a match of the data in packets with specified patterns—regular expressions, useful in the field of telecommunication technology and services. The connection may be formed within a semiconductor circuit, which serves for receiving, processing, and sending packets. This semiconductor circuit may be implemented by an FPGA-type circuit. In this way, instead of one circuit implementing the automaton with a total data width Sc, a set of simultaneously operating circuits is implemented forming several identical automata at a smaller data width Sn. This eliminates the exponential rise in the number of symbols in the automaton and at the same time it allows achieving a high throughput of the entire connection.

3 Claims, 1 Drawing Sheet

(56) References Cited

U.S. PATENT DOCUMENTS

| | | |
|---|---|---|
| 9,294,486 B1 | 3/2016 | Chiang et al. |
| 2004/0107361 A1 | 6/2004 | Redan et al. |
| 2007/0088955 A1 | 4/2007 | Lee et al. |
| 2015/0350242 A1 | 12/2015 | Sohn et al. |

* cited by examiner

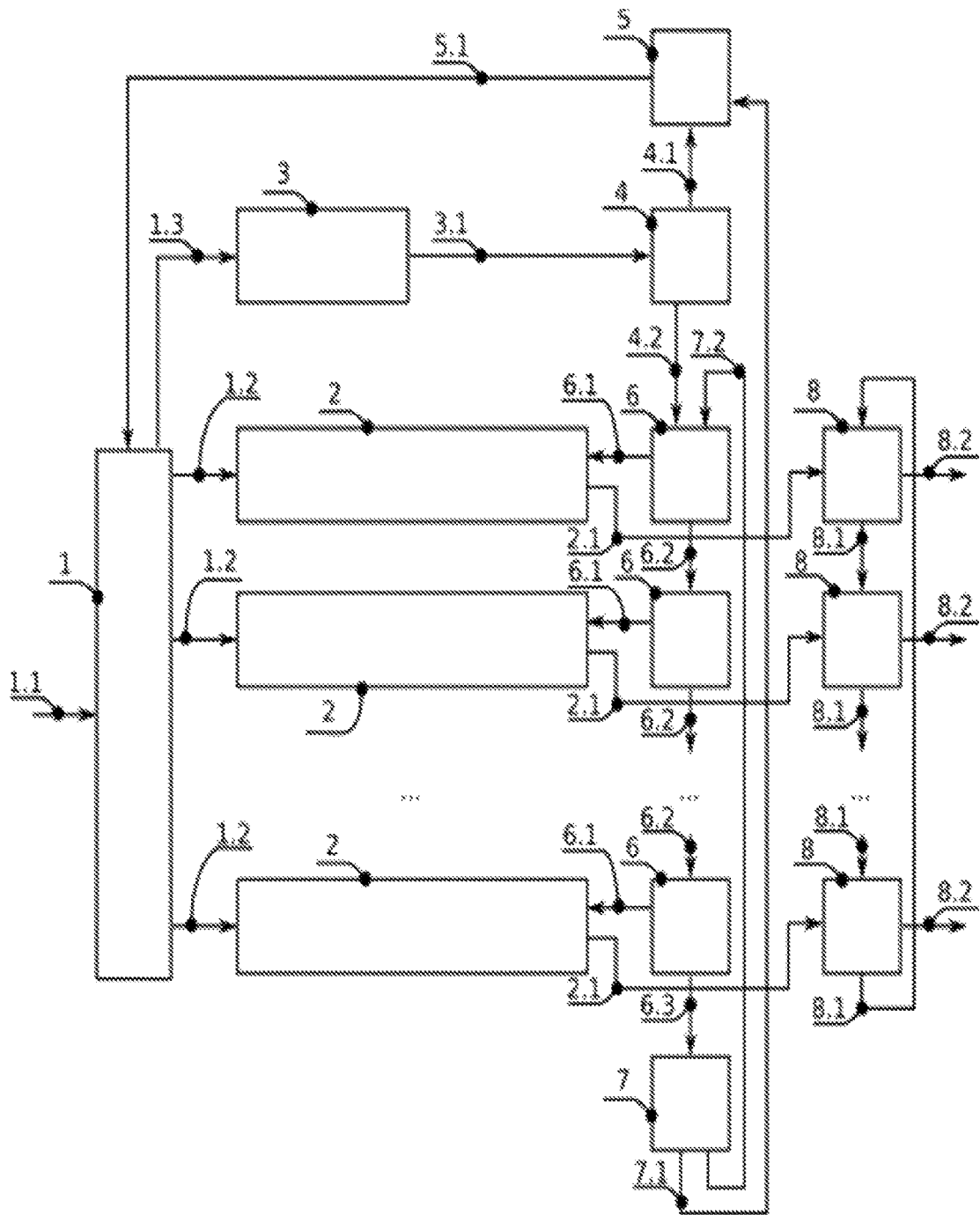

ns in Data

BACKGROUND OF THE INVENTION

The presented solution deals with a stream data processing by a computer. The data is split into blocks called packets and the task is to search for a match of the data in packets with specified patterns—regular expressions. The solution therefore belongs to the field of telecommunication technology and services.

DESCRIPTION OF PRIOR ART

Individual packets are considered as strings of symbols. The symbols' length is usually 8 bits or more. It is necessary to verify the match of these strings in regular languages, with regular languages being described by regular expressions. This operation is used to detect the presence of certain patterns in packages. This is used, for example, when searching for dangerous traffic in computer networks.

Current solutions based on the circuitry implementation use the conversion of regular expressions to deterministic or non-deterministic finite state automata and the subsequent implementation of such an automaton by means of a circuit. The data width of the circuit is equal to the length of the symbol and the total processing speed is equal to the product of the data width and the operating frequency of the circuit. Achieving a high overall processing speed in such an approach causes, due to the technical limitation in increasing the operating frequency, an increase in the data width of the circuit. This, however, results in an increase in the length of the symbol and thus causes an exponential rise in the number of symbols, respectively the complexity of the automaton, and hence the demands on the memory used or the logic of the given circuit.

SUMMARY OF THE INVENTION

The setbacks mentioned above are removed by connection for the quick search of regular expressions in data according to the presented solution. The principle of this connection is that it consists of a memory write control circuit equipped with a data input with data width $S_c$ and data outputs with data width $S_n$. Each of the data outputs is connected to the first input of one of the N block memories forming the buffer memory. The total number of the block memories is the parameter of the whole solution and it is given by the equation $N=S_c/S_n$, where $S_c$ is the total required data width of the buffer memory and $S_n$ is the data width of the individual block memories, which is identical for all block memories. Further, the memory write control circuit is equipped with an output connected to a request queue block, the output of which is connected to the read control circuit input. The reservation output of the read control circuit is connected to the first input of the reservation circuit, the output of which is connected to the memory release input of the memory write control circuit. Each block memory has its second input interconnected with the output of the read control signals of its memory management circuit. To the first input of the first block memory management circuit is connected the activation output of the read control circuit. The memory management circuits are connected in a ring such that the output of the preceding memory management circuit is always connected to the input of the next memory management circuit. The output of the last of the memory management circuits is connected to the input of the address incrementation circuit. The address incrementation circuit is, by its first output for processing termination, connected to the second input of the reservation circuit. Further, the second output of the address incrementation circuit is connected to the second input of the memory management circuit of the first block memory in the ring connection. The data output of each block memory is connected to the input of the comparator circuit relevant for the given block memory. These comparator circuits are, by their outputs of the status signals connected in the ring connection where the output of the status signal of the comparator circuit of the last block memory is interconnected with the input of the comparator circuit of the first block memory. The outputs of individual comparator circuits are the outputs of the entire connection.

In a preferred embodiment, the connection is formed within a semiconductor circuit, which serves for receiving, processing, and sending packets. This semiconductor circuit is preferably implemented by an FPGA-type circuit.

The advantage of the connection described above is that instead of one circuit implementing the automaton with a total data width $S_c$, a set of simultaneously operating circuits is implemented forming several identical automata at a smaller data width $S_n$. This eliminates the exponential rise in the number of symbols in the automaton and at the same time it allows achieving a high throughput of the entire connection.

Another advantage of this solution is a quicker search for regular expressions in data with low demands on hardware resources. Due to the fact that by increasing the data width of the circuit there is no exponential increase in the size of the automata, it is possible to create a circuit with a greater data width and hence the data throughput. It is also advantageous in that the solution is not dependent on the particular implementation of the comparator circuits, thus leaving open the possibility to improve the solution by using a more efficient implementation of the comparator circuits.

EXPLANATION OF DRAWINGS

The principle of the new solution is explained below and described based on the attached drawing, FIG. 1, showing the block diagram of the circuit.

DETAILED DESCRIPTION OF THE PREFERRED EMBODIMENTS

The subject of the new solution in general is to divide the comparator circuit implementing the status automaton at a certain data width to N comparator circuits connected in a ring and implementing N status automata at a smaller data width and operating simultaneously. The circuits providing the correct delivery of the data in the individual packets to the comparator circuits of the status automata are connected before such comparator circuits. The attached drawing shows the circuit wiring of the entire connection.

In the connection according to this circuit solution, the data input 1.1 with the width $S_c$ is connected to the input of the memory write control circuit 1. Memory write control circuit 1 is equipped with N data outputs 1.2 with the data width $S_n$, which are connected to the inputs of the individual block memories 2. There is a total of N block memories 2 in the connection, while the data width of each block memory 2 is $S_n$, and all block memories 2 together form the main buffer memory with the width $S_c$. The total number of block memories 2 is a parameter of the whole solution and is given by the equation $N=S_c/S_n$. The memory write control circuit 1 is further equipped with an output 1.3 connected to the input of the request queue block 3. The request queue block 3 is via its output 3.1 connected to the input of the read control circuit 4. The read control circuit 4 is equipped with a reservation output 4.1, which is connected to the first input of the reservation circuit 5. The output 5.1 of the reservation circuit 5 carrying the signal indicating free space is interconnected with the input of the memory write control circuit 1.

The read control circuit 4 is further equipped with an activation output 4.2, which is connected to the memory management circuit 6. The connection contains the total of N memory management circuits 6. Each of the memory management circuits 6 is equipped with the output 6.1 of the read control signal, which is connected to the input of one block memory 2. Each memory management circuit 6 is further equipped with an activation output 6.2, while the memory management circuits 6 are via the activation outputs 6.2, which are also the inputs to the next memory management circuit 6, connected in a ring. The output 6.3 of the last of the N memory management circuits 6 is connected to the input of the address incrementation circuit 7. The address incrementation circuit 7 is equipped with a first output 7.1 with information about processing termination that is interconnected with the second input of the reservation circuit 5. Further, the address incrementation circuit 7 is equipped with a second output 7.2 that is connected to the second input of the memory management circuit 6, thereby completing the ring connection of all the N memory management circuits 6. Each of the N block memories 2 is equipped with a data output 2.1 with the data width $S_n$, which is connected to one of the N comparator circuits 8 belonging to the given block memory 2. Each of the N comparator circuits 8 is equipped with an output 8.1 of the status signal, which is simultaneously the input of the next comparator circuit 8 following in the ring. By means of the outputs 8.1 of the status signals, the comparator circuits 8 are connected in a ring connection. Each of the N comparator circuits 8 is further equipped with an output 8.2, which is also the output of the entire connection.

The presented exemplary embodiment uses one FPGA circuit to create all of the above-described circuits and blocks for the specified parameters $S_c$ and N, whereby $S_n=S_c/N$.

The memory write control circuit 1 writes the packets from its data input 1.1 via its data outputs 1.2 to all N block memories 2 simultaneously and to the gradually incremented addresses, while it uses the signal with the information about free space from the output 5.1 of the reservation circuit 5 to determine the addresses of the block memories 2 where the data can be written. After the writing of each complete packet to the block memories 2 is completed, the memory write control circuit 1 informs the request queue block 3 of this fact via the signal from the output 1.3. The read control circuit 4 waits on its input for the packet write record from the output 3.1 of the request queue block 3. If the nearest memory management circuit 6 is not performing any operation, the read control circuit 4 sends a command to begin reading the packet via its activation output 4.2. Simultaneously, it sends information about this fact to the reservation circuit 5 via its reservation output 4.1. The individual memory management circuits 6 cyclically exchange information about the currently read and processed packets via the activation outputs 6.2 and at the same time they send the corresponding read commands to the block memories 2 via their outputs 6.1 of the read control signals. The cyclic information exchange is complemented by an address incrementation circuit 7, which prepares the information to be exchanged about the currently read and processed packets for the next pass through the cycle of the memory management circuits 6. If the address incrementation circuit 7 receives information about a packet that has already been completely read from the buffer memory, it sends information about such a fact via its first output 7.1 to the reservation circuit 5. The reservation circuit 5 will clear the space in the buffer memory via its output 5.1. The data outputs 2.1 of the individual block memories 2 carry the data of the packets with the data width $S_n$ to the comparator circuits 8. The comparator circuits 8 implement the status automata, while the status of each status automaton is cyclically transmitted between the comparator circuits 8 via signals from the outputs 8.1 of the status signal. The comparator circuit 8, which encounters the end of the packet, passes to its output 8.2 the information about the match or non-match of the packet data with the specified regular expressions.

INDUSTRIAL APPLICABILITY

The connection for a quick search of regular expressions in data according to the presented solution is industrially applicable in the circuits of stream or batch processing of data divided into parts—packets. Compared to commonly used solutions, it allows for increasing the data width of the circuit and thus increasing the speed of data processing, or increasing the number of regular expressions searched.

The invention claimed is:

1. A connection for a quick search of regular expressions in data wherein it consists of a the memory write control circuit equipped with the data input with the width $S_c$ and data outputs with the data width $S_n$, each of which is connected to the first input of one of N block memories forming a buffer memory, where the total number of block memories is the parameter of the whole solution and is given by the equation $N=S_c/S_n$, where $S_c$ is the total required data width of the buffer memory and $S_n$ is the data width of individual block memories, which is identical for all the block memories, and further the memory write control circuit is equipped with the output connected to the request queue block, while the output of this request queue block is connected to the input of the read control circuit and the reservation output of this read control circuit is connected to the first input of the reservation circuit, while the output of this reservation circuit is interconnected with the input for the memory release of the memory write control circuit, and each block memory has to its second input connected the output of the signals of the read control of the memory management circuit, where to the first input of the memory management circuit of the first block memory is connected the activation output of the read control circuit, and where the memory management circuits are connected in a ring connection such that always the activation output of the preceding memory management circuit is interconnected with the input of the next memory management circuit, while the output of the last memory management circuit is connected to the input of the address incrementation circuit, which is by its first output of processing termination connected to the second input of the reservation circuit, and further the address incrementation circuit is by its second output connected to the second input of the memory management circuit of the first block memory in a ring connection, and the data output of each block memory is connected to the input of the comparator circuit belonging to such block memory, where these comparator circuits are by their outputs of the status signals connected in a ring connection, where the output of the status signal of the comparator circuit of the last block memory is interconnected with the input of the comparator circuit of the first block memory, while the outputs of individual comparator circuits are the outputs of the entire connection.

2. The connection according to claim 1 wherein it is created within a semiconductor circuit.

3. The connection according to claim 2 wherein the semiconductor circuit is an FPGA-type circuit.

* * * * *